US010998983B2

(12) United States Patent
Van Weeren et al.

(10) Patent No.: US 10,998,983 B2
(45) Date of Patent: May 4, 2021

(54) FRONT END CIRCUIT FOR A NON-LINEAR SENSOR COMPRISING A CURRENT TO VOLTAGE CONVERTER AND A LIMITING BIAS CIRCUIT RESPECTIVELY CONNECTED TO THE COMMON CATHODE AND THE COMMON ANODE OF AN ARRAY OF AVALANCHE PHOTODIODE ELEMENTS

(71) Applicant: FNV IP B.V., Leidschendam (NL)

(72) Inventors: Dennis Van Weeren, Leidschendam (NL); Arnoud Marc Jongsma, Vijfhuizen (NL); Joachim Ulrich Seibert, Rijswijk (NL)

(73) Assignee: FNV IP B.V.

( * ) Notice: Subject to any disclaimer, the term of this patent is extended or adjusted under 35 U.S.C. 154(b) by 0 days.

(21) Appl. No.: 16/630,365

(22) PCT Filed: Jul. 11, 2018

(86) PCT No.: PCT/NL2018/050468
§ 371 (c)(1),
(2) Date: Jan. 10, 2020

(87) PCT Pub. No.: WO2019/013629
PCT Pub. Date: Jan. 17, 2019

(65) Prior Publication Data
US 2020/0366381 A1 Nov. 19, 2020

(30) Foreign Application Priority Data

Jul. 11, 2017 (NL) .................................... 2019224
Jul. 10, 2018 (NL) .................................... 2021279

(51) Int. Cl.
*H01L 31/107* (2006.01)
*H04B 10/80* (2013.01)
*H01L 27/146* (2006.01)

(52) U.S. Cl.
CPC ....... *H04B 10/80* (2013.01); *H01L 27/14643* (2013.01); *H01L 31/107* (2013.01)

(58) Field of Classification Search
CPC . H01L 27/14643; H01L 31/107; H04B 10/11; H04B 10/80; H04B 13/02
(Continued)

(56) References Cited

U.S. PATENT DOCUMENTS 4,271,448 A * 6/1981 Pond ................ H03K 17/08144
323/246
6,654,215 B2 11/2003 Green
(Continued)

FOREIGN PATENT DOCUMENTS

JP      201741782 A    2/2017
WO     2019013629 A2   1/2019

OTHER PUBLICATIONS

International Search Report and Written Opinion; PCT Application No. PCT/NL2018/050468; dated Mar. 20, 2019.
(Continued)

*Primary Examiner* — Que Tan Le
(74) *Attorney, Agent, or Firm* — Polsinelli PC

(57) ABSTRACT

A sensor circuit (10), including a silicon photomultiplier, SiPM, sensor (20), a voltage source (32), a current-to-voltage converter (24), and a limiting bias circuit (34). The SiPM sensor (20) has avalanche photodiode, APD, elements (30) connected in parallel between a cathode (K) and an anode (A). The voltage source (32) is configured to apply a reversed bias voltage (Vb) across the SiPM sensor, so that each APD element operates in reverse-biased Geiger mode, and the APD elements operate in integration mode. The bias circuit (34) is connected between the voltage source (32) and the anode, and is configured to limit currents through the APD elements, and to present an AC load impedance for an
(Continued)

alternating current within a predetermined operating frequency range (fo) generated by the APD elements at the anode (A) as well as a DC load impedance, such that said AC load impedance is lower than said DC load impedance.

21 Claims, 7 Drawing Sheets

(58) Field of Classification Search
USPC .......................................... 250/214 R, 214.1
See application file for complete search history.

(56) References Cited

U.S. PATENT DOCUMENTS

| | | |
|---|---|---|
| 8,395,127 B1 | 3/2013 | Frach et al. |
| 2005/0205759 A1 | 9/2005 | Wang |
| 2011/0108702 A1 | 5/2011 | Jackson et al. |
| 2013/0087710 A1 | 4/2013 | Zhang et al. |
| 2013/0248720 A1 | 9/2013 | Kim et al. |
| 2015/0069250 A1 | 3/2015 | Schmand et al. |
| 2016/0181459 A1 | 6/2016 | Birk et al. |
| 2016/0327657 A1 | 11/2016 | Zhang et al. |
| 2017/0030769 A1 | 2/2017 | Clemens et al. |

OTHER PUBLICATIONS

Machine Translation of JP201741782; retreived Mar. 14, 2019.
Donati, Silvano et al., "Single-Photon Detectors: From Traditional PMT to Solid-State SPAD-Based Technology", IEEE Journal of Selected Topics in Quantum Electronics, vol. 20, No. 6; Nov. 1, 2014.
Anonymous: "Si APD, MPPC", Aug. 28, 2014, XP055469058, Retrieved from the internet: URL: http://www.hamamatsu.com/resources/pdf/ssd/e03_handbook_si_apd_mppc.pdf on Apr. 20, 2018.
Gil, A. et al., "Programmable power supply system for SiPM bias", Nuclear Sceince Symposium and Medical Imaging Conference (NSS/MIC), Oct. 23, 2011; pp. 787-790.
Schumacher, Johannes et al.. "Front-end Electronics for Silicon Photomultipliers", Jan. 2014; Physikalischen Institut A.

* cited by examiner

FRONT END CIRCUIT FOR A NON-LINEAR SENSOR COMPRISING A CURRENT TO VOLTAGE CONVERTER AND A LIMITING BIAS CIRCUIT RESPECTIVELY CONNECTED TO THE COMMON CATHODE AND THE COMMON ANODE OF AN ARRAY OF AVALANCHE PHOTODIODE ELEMENTS

CROSS-REFERENCE TO RELATED APPLICATIONS

This application is a national stage application of International Application No. PCT/NL2018/050468, which was filed on Jul. 11, 2018, which claims priority to Netherlands Application Number 2019224 filed on Jul. 11, 2017, and claims priority to Netherlands Application Number 2021279 filed on Jul. 10, 2018, of which is incorporated by reference in its entirety.

TECHNICAL FIELD

The invention relates to a front-end circuit for a non-linear sensor. Furthermore, the invention relates to a method for operating such a circuit.

BACKGROUND ART

Electronic sensors, as used in measurement devices and communication devices, often exhibit non-linear behaviour. Such non-linear behaviour could influence the intended measurements or receptions by intermodulation. Intermodulation (IM) or intermodulation distortion (IMD) is the amplitude modulation of signals containing two or more different frequencies, caused by nonlinearities or time variance in a system.

Non-linear electronic sensors can be sensors such as a Light Dependent Resistor (LDR), photodiodes (PD), avalanche photodiodes (APD), Silicon Photomultipliers (SiPM), Hall effect sensors, negative temperature coefficient (NTC) resistors or positive temperature coefficient (PTC) resistors. All said detectors have in common that the sensed property will change the electrical behaviour of the sensor, e.g. by allowing a greater current at a given bias voltage.

A sensor of a particular type, the Silicon Photomultiplier (SiPM), has emerged as an interesting photo-detection solution for sensing applications with very low intensity levels down to a single photon. A SiPM-based sensor offers several advantages, such as low operational voltage, good photon detection efficiency (PDE), high detection gain, and fast response times. These properties render SiPM sensors very useful as photon counting devices in scientific or medical instruments. A SiPM is formed by an array of avalanche photodiode (APD) pixel elements that are operated in Geiger mode. In this mode, the APD elements are subjected to a reverse bias voltage for which the absolute value is higher than the characteristic breakdown voltage of each APD element. When a photon hits an APD element, an avalanche breakdown is triggered, which leads to the generation of an output current pulse. The APD can thus function in a so-called "photo counting mode", in which single photon detections can be recorded and counted. An APD element operated in this mode is referred to as a single photo avalanche diode (SPAD). The fundamental difference between SPADs and APDs is that SPADs are specifically designed to operate with a reverse bias voltage well above the breakdown voltage.

The above-mentioned properties make SiPM sensors suitable for applications in free space visible light communication (VLC) systems, and in particular for underwater VLC systems. However, when optical communication methods are used that rely on amplitude modulation for coding information into the light beam, the SiPM should be operated in a so-called "integration mode". In said mode, an output signal is generated that represents a statistical average of a large number of photons from the impinging light beam. For this mode, the SiPM preferably includes a very large number of APD elements, e.g. in the order of thousands or more elements, which are connected in parallel. An amplitude-modulated optical signal with certain intensity may then simultaneously trigger many temporally overlapping avalanche discharges in the SiPM, so that a SiPM output signal can be obtained that is formed from a sum of many photon detection currents from the individual APD elements. If the number of simultaneous detections is sufficiently large, the sum of detection currents will closely follow the amplitude modulation of the incoming light beam. This mode of operation imposes new design challenges when using SiPM sensors.

In general, most circuits of the prior art are concerned with photo counting mode and therefore cannot be easily applied to integration mode, which is advantageous for free space VLC systems.

A VLC receiver is a communication receiver with all the associated design challenges. Such receivers should have a low noise floor, good frequency selectivity, low intermodulation (IM) distortion, high dynamic range, etc. Good frequency selectivity and high dynamic range are important when there are multiple light sources that may interfere with the light communication signal. Examples of such conditions could be an office environment having ambient and modulated light sources like fluorescent lighting, flat panel backlights, infrared (IR) communications, etc., or an underwater environment, where an ROV might be equipped with mounted laser scanners, dimmable floodlights or other systems using modulated light.

These modulated light sources might interfere with the communication signal in an improperly operated SiPM causing a distortion effect called intermodulation. The wanted and unwanted signals are then impossible to separate during later processing.

SiPM sensors are vulnerable to over-currents. In order to overcome this problem, commonly current-limited power supplies are used, as shown in the SiPM Experiment Guide by Sensl. Current-limiting circuits have a non-zero source resistance when operating at or near their current limit. A non-zero source resistance will cause the voltage over the SiPM to vary with the current through the SiPM, thereby varying the gain which may cause intermodulation distortion.

Patent document US 2016/0181459 A1 describes a method for improving the dynamic range in integration mode by applying an automatic gain control method. However, this document does not solve the intermodulation distortion when using a SiPM in a visible light communication system in integration mode.

It would be desirable to provide a protective front-end circuit for a SiPM sensor in a free space VLC receiver.

SUMMARY OF INVENTION

The present invention addresses the above-mentioned challenges, most importantly the inherent intermodulation distortion caused by state of the art front-end circuits.

According to a first aspect, there is provided a sensor circuit comprising, as illustrative embodiment, a silicon photomultiplier (SiPM) sensor, a voltage source, a current-to-voltage converter, and a limiting bias circuit. The SiPM sensor includes an array of avalanche photodiode (APD) elements that are connected in parallel between a common cathode and a common anode. The voltage source is configured to apply a reversed bias voltage across the APD elements, to let each of the APD elements operate in reverse-biased mode, and to let the array of APD elements operate in integration mode. The current-to-voltage converter is electrically connected with an input terminal to the common cathode of the APD elements, and configured to convert a current from the common cathode into a voltage and provide said voltage on an output terminal of said converter. The limiting bias circuit is connected between the voltage source and the common anode of the APD elements. This filter is configured to limit currents through the APD elements, and configured to present an AC load impedance for an alternating current within a predetermined operating frequency range fo of the light modulation generated by the APD elements at the common anode as well as a DC load impedances, such that said AC load impedance is lower than said DC load impedance. The AC load impedance may for instance be in a range of 10 to 10000 times lower than the DC load impedance. Depending on circumstances, said AC load impedance to said DC load impedance may differ by other factors, given that said AC load impedance is always lower than said DC load impedance.

Briefly stated, the present invention minimizes the intermodulation distortion and maximizes the dynamic range by using a different front-end circuit making a SiPM thus suitable to be used in a VLC system. In situations with ambient light sources, a noise floor is created which, in conventional circuits would reduce the dynamic range of a VLC receiver.

SiPM sensors are known to have a gain characteristic in which the detection output current increases with increasing value of reversed bias overvoltage applied across the APD elements. The limiting bias circuit limits the maximum current passing through the APD elements during avalanche discharge, and simultaneously presents a low load impedance for alternating currents generated within the APD elements, at least for current oscillations within a predetermined operating frequency range fo representing the optical signals that the SiPM is expected to receive. This operating frequency range fo covers not only the (sub-)band Δfc for the actual VLC signal (with centre frequency fc), but also additional frequency components associated with interfering light that oscillates at different frequencies than the VLC frequency range. The bias circuit is designed such that the voltage over the SiPM is kept as constant as possible, thereby realising an overvoltage regularization. Because of this overvoltage regularization, the signal gain provided by the SiPM sensor is kept as constant as possible, so that the SiPM output responds as linearly as possible to amplitude variations in the detected light. Due to the near constant gain and linear amplitude response, the SiPM sensor converts a harmonic incoming light signal into an essentially harmonic electrical output signal, while avoiding creating higher order harmonic components in the electrical output signal. When the SiPM sensor is simultaneously receiving multiple optical signals with at least two distinct frequency components, e.g. both a communication signal and an interference signal on another frequency, the occurrence of intermodulation in the SiPM output current is reduced or even eliminated.

In embodiments, the bias circuit presents an AC load impedance lower than the DC load impedance for frequencies above a lower frequency bound. This is to allow for slow changes in ambient light conditions to prevent overheating of the SiPM sensor. Further, this allows for slow changes in ambient light to change the bias voltage over the SiPM and thus regulate the gain and PDE of the SiPM. The lower bound of said frequencies may for instance be 100 kHz, 10 kHz, 1 kHz, 100 Hz, 10 Hz, 1 Hz or 0,1 Hz. In addition, said bias circuit may optionally have an upper frequency bound. The upper frequency bound may for instance be one of 1 MHz, 10 MHz, and 100 MHz.

In embodiments, the DC load impedance of the bias circuit is such that the current through the SiPM is limited to a value that prevents overheating of the SiPM. Further, the DC load impedance may be optimized to reduce the power consumption of the SiPM in high ambient lighting. Even further, the DC load impedance may act as an AGC by reducing the bias voltage under high ambient lighting. The DC load impedance may be, for example, in a range of 100 kΩ-10Ω. The AC load impedance for said operating frequency range is in a range between 0Ω and 1 kΩ, more preferably between 0Ω and 100Ω and most preferably between 0Ω and 10Ω.

In embodiments, the bias circuit comprises a limiter resistor R1, which is connected in series between the voltage source and the common anode of the SiPM.

The resistor R1 electrically interconnects the SiPM and the voltage source, and acts to limit the maximum current drawn from the voltage source that will pass through the SiPM. This resistor R1 may simultaneously form or substantially contribute to the DC load impedance seen by the SiPM at the common anode.

The linear range of a SiPM is limited by the number of APD elements contained within the SiPM. The SiPM will saturate if all APD elements are firing at the same time. By reducing the voltage over the SiPM, the photo detection efficiency and gain are reduced as well thereby limiting the number of simultaneous firing APD elements. Therefore, in some embodiments, the output voltage of the voltage source and a resistance of the limiter resistor are selected so that the resulting average overvoltage across the SiPM causes operation in a linear part of a photon detection efficiency response characteristic and gain characteristic of the SiPM sensor.

Both the photon detection efficiency and the gain of the SiPM sensor are dependent on the bias voltage or bias over-voltage across the APD elements. As long as the SiPM sensor is not operating in a saturated portion of its PDE and gain characteristics, more incident light that hits the APD elements will cause more current to flow through the resistor R1 (at least for quasi-static i.e. relatively slow variations in the incident light intensity). Because of the constant output of voltage source 32 and fixed value for R1, this current increase will cause the bias voltage across the APD elements to become lower. In this manner, both the gain and the PDE are automatically reduced, at least for slow light intensity fluctuations that have longer characteristic time scales than the response time for the shunting function of the filter. For instance the breakdown voltage of the APD elements may be about 24.5 Volts (or within a range of 24.2 Volts to 24.7 Volts), an overvoltage of the APD elements may be within a range of 1.0 Volts to 5.0 Volts, the output voltage of the voltage source may be about 27 Volts, and the limiter resistor may have a resistance of about 120Ω.

In further embodiments, the bias circuit comprises a capacitor C1 that is connected between the resistor and the common anode on the one hand, and to ground on the other hand. This capacitor may for instance have a capacitance of at least 100 µF.

The limiter resistor and the capacitor jointly form a passive low-pass RC-filter, which is provided between (and electrically connected to) the SiPM sensor and the voltage source. The low-pass RC filter is configured to present a low load impedance for alternating currents within a predetermined operating frequency range fo originating from the SiPM anode, such that current oscillations resulting from avalanche discharge due to incoming optical signals at frequencies within the predetermined operating frequency range fo are essentially shunted via the capacitor C1, and the bias voltage Vb across the SiPM is kept essentially constant for incoming optical signals within this operating frequency range. Intermodulation effects in the output response of the SiPM sensor are thus suppressed.

In alternative embodiments, the bias circuit comprises a resonant circuit section that is connected in parallel between the resistor and the common anode on the one hand, and to ground on the other hand. This circuit section includes a capacitor and an inductor connected in series, and is configured to present the low load impedance for alternating currents within at least part of the predetermined operating frequency range generated by the APD elements at the common anode.

The limiter resistor and series LC circuit section jointly form a passive band-stop LC-filter, which is provided between (and electrically connected to) the APD elements and the voltage source. The values for L and C in the resonant circuit section may be selected such that the complex impedance $Z(f)=j \cdot X_L(f)+j \cdot X_C(f)=2\pi \cdot j \cdot f \cdot L - j/2\pi \cdot f \cdot C$ vanishes at a centre frequency fi and has generally low impedance values in the range Δfi around this centre frequency, so that the LC resonant circuit section essentially acts as a shunt for the alternating APD currents within this operating frequency range.

In yet a further embodiment, the low-pass filter comprises further resonant circuit sections that are connected in parallel between the resistor and the common anode on the one hand, and to ground on the other hand. Each of the further circuit sections includes a further capacitor and a further inductor connected in series, and each is configured to present a low load impedance for alternating currents within further parts of the predetermined operating frequency range generated by the APD elements at the common anode.

A plurality of LC resonant circuit sections with different centre frequencies and adjacent and possibly overlapping resonant frequency bands can be used to form low load impedances for alternating currents from the APD element array over a wider operating frequency range. Each LC resonant section may cover a sub-band fi of the operating frequency range fo representative of the optical signals that the SiPM sensor is expected to receive.

In circumstance where the interfering frequencies are known, the LC resonant circuits can be tuned to these frequencies such that the risk of intermodulation is reduced.

In alternative embodiments, the bias circuit may employ active components like transistors, operational amplifiers, signal processors using analogue to digital converters (ADC) and/or digital to analogue converters (DAC), microprocessors, DC to DC converters, inverters and similar such devices.

In one of such embodiments, the active circuit may act as a time-varying current limiter. Said active circuit uses an optimized time constant such that the load resistance for AC currents is as low as possible over the operating frequency range, while at the same time the SiPM is always operating within the safe operating area (SOA) similar to power semiconductor devices.

In another one of such embodiments, the active circuit may act as a plurality of time-varying current limiters. Each of said current limiters uses an optimized current limit. Further, each of said current limiters uses an optimized time constant. For example, one of said current limiters is optimized to operate the SiPM within the SOA. A second of said current limiters could be optimized to mitigate intermodulation effects from certain ambient and/or artificial light sources. In embodiments with several current limiters, the first current limiter is optimized to protect the SiPM from overcurrent, while additional current limiters are optimized, e.g. in their time constant and current limiting effect, to mitigate effects of ambient light sources.

In a further of such embodiments, the passive components of said bias circuits may be implemented using active circuitry which form gyrators, e.g. using operational amplifiers.

In embodiments, the current-to-voltage converter comprises a common-base circuit, including a transistor with an emitter that is connected to the common cathode of the SiPM sensor, with a base that is connected to ground, and with a collector that forms a signal output.

The common-base circuit is configured to present at the emitter a low load impedance for an alternating current from the common cathode of the SiPM sensor, to assist the bias circuit in keeping the reverse bias voltage across the APD elements as constant as possible. The common base of the transistor electrically isolates the SiPM sensor from the subsequent detector circuit components. The emitter of the transistor presents a further AC load impedance for the alternating current within the predetermined operating frequency range fo that is generated by the APD elements at the common cathode. This further AC load impedance may be in the order of Ohms to tens of Ohms, depending on the amplitude of the alternating current generated at the cathode.

In embodiments, the current-to-voltage converter comprises an operational amplifier with an output, a non-inverting input that is connected to ground, and with an inverting input that is connected to the common cathode of the APD elements as well as to a feedback voltage from the output via a further resistor. Other types of amplifiers may be used in alternative embodiments.

In further embodiments, the sensor circuit includes a further resistor Rp that is connected in parallel with the SiPM sensor and between the current-to-voltage converter and the current limiting bias circuit. This further resistor is configured to maintain a non-zero baseline current through the current-to-voltage converter.

The further resistor Rp electrically interconnects the current-to-voltage converter and the current limiting bias circuit, preferably with one terminal of the further resistor connected between the resistor R1 on the one hand, and the capacitor C1 or the LC resonant circuit sections on the other hand.

In embodiments, the sensor circuit comprises a parallel resonant band-pass filter, which is provided between the output of the current-to-voltage converter and an analogue sensor output, and which is configured to pass only a frequency range corresponding to a carrier wave and a maximum bitrate of the communication signal to the analogue sensor output.

In a second aspect, and in accordance with the advantages and effects described herein above, there is provided a method for operating a sensor circuit according to the first aspect. The method comprises:

applying, with the voltage source, a reversed bias voltage across the APD elements of the SiPM sensor, to let each of the APD elements operate in reverse-biased mode, and to let the array of APD elements operate in integration mode;

receiving, with the APD elements, a plurality of amplitude-modulated light signals which oscillate in time corresponding to frequency bands within a predetermined operating frequency range fo;

converting, with the current-to-voltage converter, a current from the common cathode of the array of APD elements into a voltage, and providing said voltage on the output terminal of said converter, and;

forming, with the bias circuit, an AC load impedance for an alternating current within the predetermined operating frequency range generated by the APD elements at the common anode, as well as a DC load impedance, such that said AC load impedance is lower than said DC load impedance, thereby reducing or minimizing intermodulation distortion in the current generated by the SiPM sensor in response to the received light signals. The AC load impedance may for instance be 10 to 10000 times lower than the DC load impedance.

Exemplary embodiments of the present disclosure will be described herein below with reference to the accompanying drawings. However, the embodiments of the present disclosure are not limited to the specific embodiments and should be construed as including all modifications, changes, equivalent devices and methods, and/or alternative embodiments of the present disclosure.

The terms "have," "may have," "include," and "may include" as used herein indicate the presence of corresponding features (for example, elements such as numerical values, functions, operations, or parts), and do not preclude the presence of additional features.

The terms "A or B," "at least one of A or/and B," or "one or more of A or/and B" as used herein include all possible combinations of items enumerated with them. For example, "A or B," "at least one of A and B," or "at least one of A or B" means (1) including at least one A, (2) including at least one B, or (3) including both at least one A and at least one B.

The terms such as "first" and "second" as used herein may modify various elements regardless of an order and/or importance of the corresponding elements, and do not limit the corresponding elements. These terms may be used for the purpose of distinguishing one element from another element. For example, a first element may be referred to as a second element without departing from the scope the present invention, and similarly, a second element may be referred to as a first element.

It will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

The expression "configured to (or set to)" as used herein may be used interchangeably with "suitable for" "having the capacity to" "designed to" "adapted to" "made to," or "capable of" according to a context. The term "configured to (set to)" does not necessarily mean "specifically designed to" in a hardware level. Instead, the expression "apparatus configured to . . . " may mean that the apparatus is "capable of . . . " along with other devices or parts in a certain context.

The terms used in describing the various embodiments of the present disclosure are for the purpose of describing particular embodiments and are not intended to limit the present disclosure. As used herein, the singular forms are intended to include the plural forms as well, unless the context clearly indicates otherwise. All of the terms used herein including technical or scientific terms have the same meanings as those generally understood by an ordinary skilled person in the related art unless they are defined otherwise. The terms defined in a generally used dictionary should be interpreted as having the same or similar meanings as the contextual meanings of the relevant technology and should not be interpreted as having ideal or exaggerated meanings unless they are clearly defined herein. According to circumstances, even the terms defined in this disclosure should not be interpreted as excluding the embodiments of the present disclosure.

For the purpose of determining the extent of protection conferred by the claims of this document, due account shall be taken of any element which is equivalent to an element specified in the claims.

BRIEF DESCRIPTION OF DRAWINGS

Embodiments will now be described, by way of example only, with reference to the accompanying schematic drawings in which corresponding reference symbols indicate corresponding parts. In the drawings, like numerals designate like elements.

Figure 1:
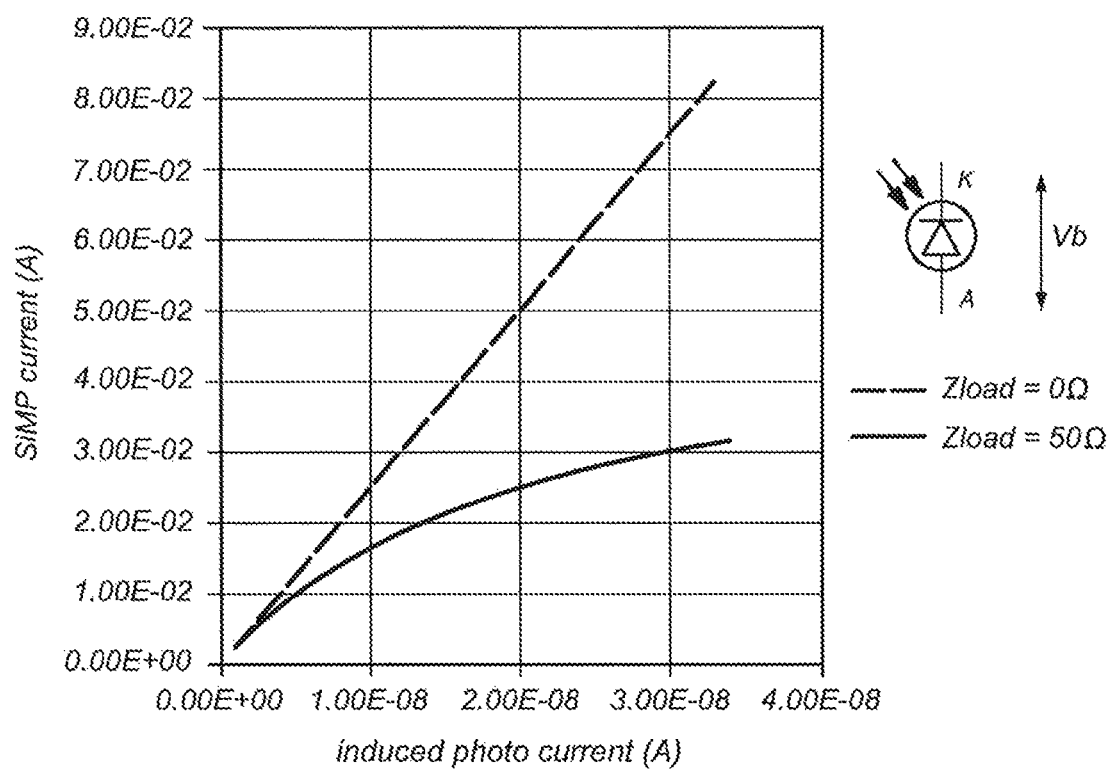
FIG. 1 shows a graph with two exemplary current transfer functions for SiPM sensors connected to driving circuits with different load impedances.

The figures are meant for illustrative purposes only, and do not serve as restriction of the scope or the protection as laid down by the claims.

DESCRIPTION OF EMBODIMENTS

The following is a description of certain embodiments of the invention, given by way of example only and with reference to the figures.

In general, a SiPM sensor may include a matrix of reverse-biased Geiger Mode avalanche photodiode (APD) elements, which are connected in parallel between a common cathode K and a common anode A. A reverse bias voltage Vb or $V_{SiPM}$ applied across the APD elements is formed as a sum of a breakdown voltage Vbd and an overvoltage Vo. The breakdown voltage Vbd is a minimum reverse bias voltage that is needed to induce self-sustaining avalanche multiplication in an APD element upon detection of a photon. For this discussion, the breakdown voltage Vbd is selected to be 24.5 Volts, but in practice can have other values depending on the design of the SiPM sensor. The overvoltage Vo is the excess reverse bias voltage across the APD elements.

During operation, the APD elements receive optical signals and produce electrical photocurrents with magnitudes that depend on the intensity of the incident light. In addition, the signal gain produced by the SiPM sensor—which in this discussion is in the order of $10^6$—is highly dependent on the value for the overvoltage Vo across the common cathode and anode of the APD elements. For example, the gain of an exemplary SiPM sensor may be approximated by equation 1:

$$\text{gain}_{SiPM} = (V_{SiPM} - 24.5) \cdot 10^6 \quad (1)$$

In this equation, $V_{SiPM}$ is the voltage applied across the common cathode and anode of the APD elements. The voltage dependency of the photo detection efficiency (PDE) has been ignored in equation 1 for simplicity. The current passing through the SiPM sensor may be calculated by equation 2:

$$I_{SiPM} = \text{gain}_{SiPM} \cdot I_{photo} \quad (2)$$

In this equation, $I_{photo}$ is the induced photocurrent before multiplication.

It will be understood that a biasing circuit, which is directly electrically connected to the SiPM sensor, presents a complex load $Z_{load}$ to the SiPM sensor. The voltage $V_{SiPM}$ will thus depend on the current $I_{SiPM}$ according to equation 3:

$$V_{SiPM} = V_{set} - Z_{load} \cdot I_{SiPM} \quad (3)$$

In this equation, $V_{set}$ is the set-point voltage applied across the common cathode and anode of the APD elements, which corresponds to the voltage when no current is flowing through the SiPM. Substituting equations 1, 2 and 3 into each other yields equation 4, which describes the current through the SiPM as a function of the set-point voltage $V_{set}$, the induced photocurrent $I_{photo}$, and the load impedance $Z_{load}$.

$$I_{SiPM} = \frac{(V_{set} - 24.5) \cdot 10^6 \cdot I_{photo}}{1 + Z_{load} \cdot 10^6 \cdot I_{photo}} \quad (4)$$

From equation 4, it becomes clear that the current transfer function of the SiPM becomes a non-linear function of the photocurrent $I_{photo}$ for load impedances other than 0Ω. FIG. 1 plots results for two exemplary load impedance values |Z|=0Ω and |Z|=50Ω. It is apparent from FIG. 1 that the current transfer function becomes non-linear for even small values of |Z|.

One cause of the intermodulation in SiPM photo receivers in integration mode is non-linearity. Said non-linearity may be caused by varying gain and PDE. Said gain and PDE are dependent on the applied bias voltage. Another cause of intermodulation is saturation in the SiPM if too much incident light hits the surface of the SiPM. The solution to minimize the intermodulation distortion is thus to keep the bias voltage over the SiPM as constant as possible for AC signals while allowing some variation for DC signals. In addition, some form of automatic gain control is necessary to prevent the SiPM from saturating.

According to the present invention, the problem of this non-linearity is recognized, and is mitigated by keeping the load impedance as seen by the SiPM sensor as low as possible for modulated light in frequency ranges that the SiPM sensor is expected to receive.

Figure 2:
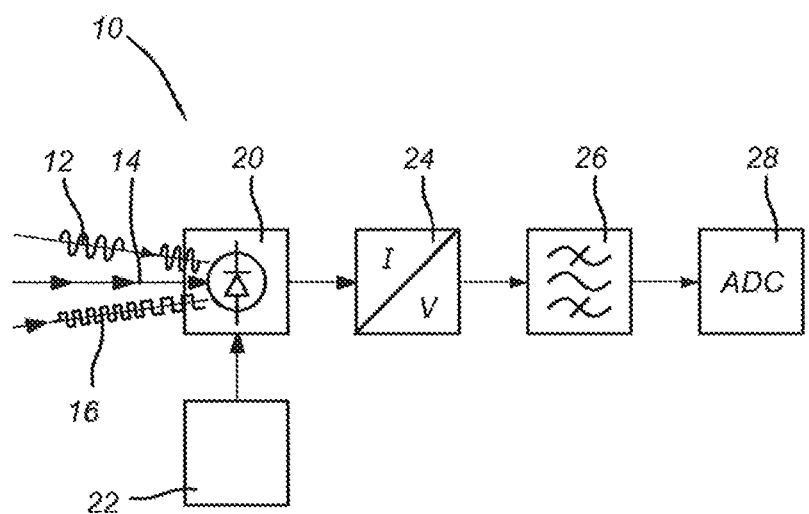
FIG. 2 shows a block diagram for a sensor circuit, according to an embodiment.
Figure 3A:
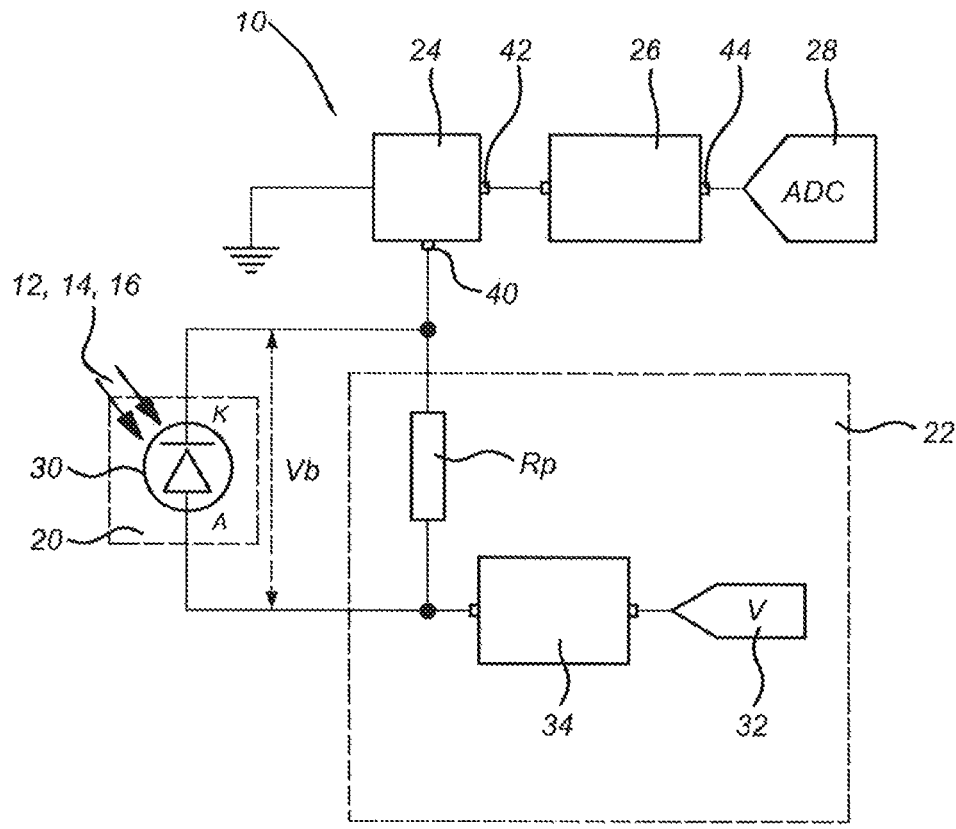
FIG. 3A presents a diagram for a sensor circuit according to a further embodiment.
Figure 3B:
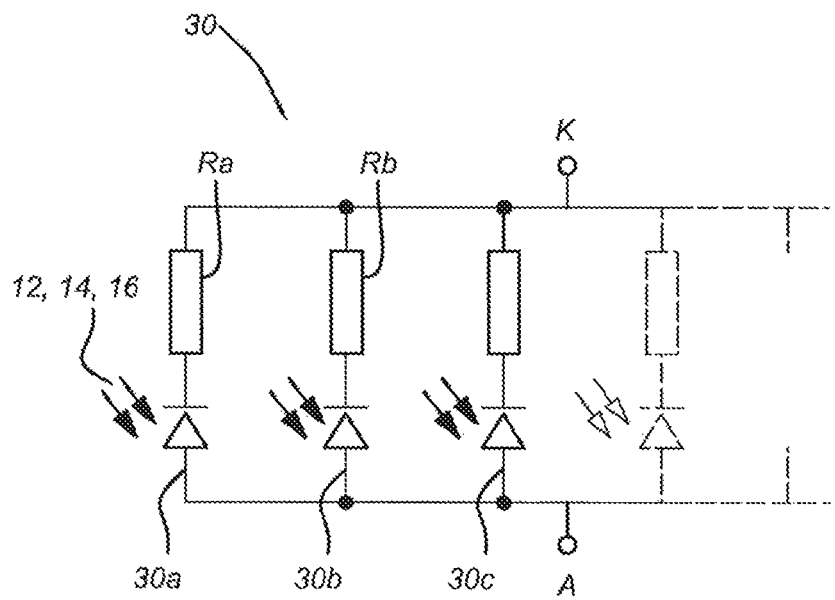
FIG. 3B presents a detail from the circuit of FIG. 3A.

FIGS. 2 and 3A-3B show block diagrams for a SiPM front end circuit 10, which may be used in a VLC receiver, for instance in a VLC receiver of an underwater communication system. As shown in FIGS. 2 and 3A, the circuit 10 comprises a SiPM module 20, a bias circuit section 22, and a current-to-voltage converter stage 24. The sensor circuit 10 may further include a bandpass filter 26, and an analogue-to-digital converter (ADC) 28.

FIGS. 3A and 3B show that the SiPM sensor 20 comprises an array of APD elements 30, which are connected in parallel between a common cathode K and a common anode A. The APD elements 30 are collectively indicated in FIG. 3A by reference numeral 30 for simplicity, whereas FIG. 3B illustrates the parallel arrangement of individual elements 30k (k=a, b, c, . . . ) with associated internal resistors Rk for passive quenching. The APD elements 30 are configured to allow sensing of optical signals 12, 14, 16 originating from various sources in the vicinity, and to produce electrical output currents that have magnitudes that relate to the intensity of the incident light.

The VLC signal 12 of interest may be light of a predetermined wavelength, which is first amplitude modulated at a fixed centre frequency fc to form the data carrier (e.g. in the range of several Hz to several GHz), and in which the actual data is imprinted by further modulation using a modulation scheme with a predetermined maximum data bitrate that is substantially lower than the centre frequency fc.

Light signals 16 from other amplitude-modulated sources may also be present, which may simultaneously impinge on the SiPM sensor 20 and cause interference with the VLC signals 12 of interest. These interfering light signals 16 may for instance fall within frequency ranges in a bandwidth from several Hz to several hundreds of MHz. Ambient light 14 with static or very slowly amplitude variation characteristics may also be simultaneously received by the SiPM sensor 20.

For instance, in underwater VLC applications, VLC signals 12 may be formed by amplitude modulation of blue light using a carrier frequency fc of 800 kHz. In this example, modulation with a predetermined maximum data bitrate is used.

In principle, a bitrate value between several bits per second to hundreds of megabits per second may be used, depending on the carrier frequency and modulation type. Possible bitrates may be 5 bits/sec to 100 Mbps (mega bit per second). In some embodiments, bitrates of 10 bits/sec to 1 Mbps may be advantageous. A preferred implementation uses a bit rate of 25 kbps.

The wavelength of the light is not generally limited to a certain range. However, the optimum wavelength might be dictated by the propagation medium in which the VLC system operates. Further wavelength limitations can be caused by the choice of the sensor. Blue light can advantageously be used in sea water because of its penetration depth in deep sea water. However, other wave lengths than blue can be used, e.g. green/yellow light also works and can advantageously be used in coastal waters and inland waters, e.g. fresh water, like a lake.

Of course, other carrier frequencies than 800 kHz can be chosen if desired. An example operating frequency range of the amplitude modulation may be 500-1500 kHz, preferably 700-1250 kHz and most preferably 750-850 kHz, with 800 kHz as a suitable example. However, higher values than 1500 kHz need be used when very high bit rates are desired. A bit rate of 100 Mbps could require a minimum carrier frequency of 60 MHz.

The VLC signal 12 may for instance be formed by modulating data signals via binary phase shift keying (BPSK) or differential phase shift keying (DPSK) or any other well-known modulation technique with a predetermined maximum bitrate onto the carrier wave with frequency fc. In an alternative embodiment, the data may be directly modulated onto the light beam e.g. without a carrier, using pulse position modulation (PPM), pulse width modulation (PWM) or any other suitable modulation.

In a deep subsea environment, ambient sunlight is absent, but there may be other interfering light sources, for example an ROV or UAV may be equipped with LED spot- or floodlights. LED lights may be pulse width modulated (PWM) dimmable/controllable light sources, and typical PWM LED driving frequencies range from several tens of Hz up to several hundreds of kHz.

In a shallow subsea environment, ambient sunlight could be present in addition to the aforementioned interfering light sources. Such ambient sunlight can exhibit variations in brightness, which might cause interference with the VLC receiver. The embodiments of the present invention mitigate the effects caused by said interference.

The current-to-voltage converter 24 is configured to receive a current output of the SiPM sensor 20, and to produce a voltage suitable for subsequent processing. The current-to-voltage converter 24 is electrically connected with an input terminal 40 to the common cathode K of the APD elements 30, and configured to convert a current from the common cathode K into a voltage and to provide said voltage on an output terminal 42 of the converter 24, as shown in more detail in FIGS. 3A-B.

The load impedance Z as perceived by the SiPM module 20 is jointly determined by the bias circuit section 22 and the current-to-voltage converter 24. The bias circuit section 22 and the current-to-voltage converter 24 together present a low load impedance |Z| to the SiPM module 20 for all signal oscillations falling within operating frequency range fo in which both the amplitude-modulated VLC signals 12 and the amplitude-modulated interference signals 16 are expected to reside, to reduce oscillations in the bias voltage Vb across the SiPM sensor (20). Such operating frequency range fo of the amplitude-modulated VLC signals 12 and the amplitude-modulated interference signals 16 may e.g. be in the range of 1 Hz to 100 MHz. Sources of these interferences may be for example laser scanners, time-of-flight sensors, photographic strobe lights, indicating lights, or other data communication systems. A preferred impedance |Z| presented by the bias circuit section 22 in the operating frequency range fo of the amplitude-modulated VLC signals 12 and the amplitude-modulated interference signals 16 may e.g. be 0 Ohm<|Z|<10 Ohm, more preferably 0 Ohm<|Z|<5 Ohm and most preferably 0 Ohm<|Z|<2 Ohm in order to obtain an as high as possible linearity between SiPM current and induced photo current, see FIG. 1. As shown in FIG. 3A, the bias circuit section 22 comprises a voltage source 32, and a current limiting bias circuit 34. The voltage source 32 is configured to contribute to the reversed bias voltage Vb that is applied across the APD elements 30. This bias voltage Vb allows each of the APD elements 30 to operate in reverse-biased mode and to let the SiPM sensor 20 operate in integration mode.

The filter 34 is connected between the voltage source 32 and the anode A of the SiPM sensor 20. This filter 34 is configured to set a maximum average current passing through the SiPM sensor 20, to limit power dissipation. A maximum dissipation is determined by the type and size of the SiPM sensor 20 and other factors, but may be in the range of several milliwatts to several hundreds of milliwatts. The filter 34 is further configured to present a low impedance Z for oscillating currents within the predetermined operating frequency range fo generated by the SiPM sensor 20 at the anode A, such that oscillations in the bias voltage Vb at frequencies within this range fo are suppressed or eliminated to a predetermined low level. This may be achieved by presenting an AC load impedance |Z| at anode A for alternating currents in the operating frequency range fo of the amplitude-modulated VLC signals 12 and the amplitude-modulated interference signals 16 smaller than the DC impedance value of the current limiting bias circuit 34. In one example, the DC impedance of the bias circuit 34 is in a range of 50Ω-10 kΩ, in another example in a range of 100Ω-5 kΩ and in a further example 500Ω-5 kΩ. The actual chosen DC impedance depends on the implemented SiPM. Then, the AC load impedance |Z| for said operating frequency range fo may be in a range of 0Ω<|Z|<10Ω, more preferably 0Ω<|Z|<5Ω and most preferably 0Ω<|Z|<2Ω.

In an embodiment, using a MicroFC-30020-SMT-A 1 made by Sensl, a series current limiting resistor of 1.2 kΩ and a shunt capacitor of 10 uF is used. The capacitor has an impedance of $-j16\Omega$ at 1 kHz which decreases with increasing frequency. The series resistor or DC resistor depends on the maximum allowable power dissipation of the SiPM and can be quite large.

The choice of such a series current limiting resistor value is dictated by the maximum current one wishes to allow through the SiPM. The current limit may be dictated by the maximum allowed dissipation of the SiPM or the maximum power consumption one wishes to allow, in case of high ambient light levels, when supply power availability is limited, e.g. when using a battery supply.

The maximum shunt capacitor value in combination with a certain resistor (the RC time constant) is dictated by the maximum time one wishes to allow the system to adjust to a new level of average incident light, which translates into an average current. In principle, one wishes this RC time constant to be as large as possible, but there are limits for both resistor and capacitor to keep the SiPM sensor in the safe operating area. In case of high expected ambient light levels, the series current limiting resistor value may have to be chosen low to avoid that the gain of the SiPM drops to unsatisfactory levels. In environments with low ambient light levels, e.g. in the deep ocean, resistor values can be chosen much higher.

Figure 4:
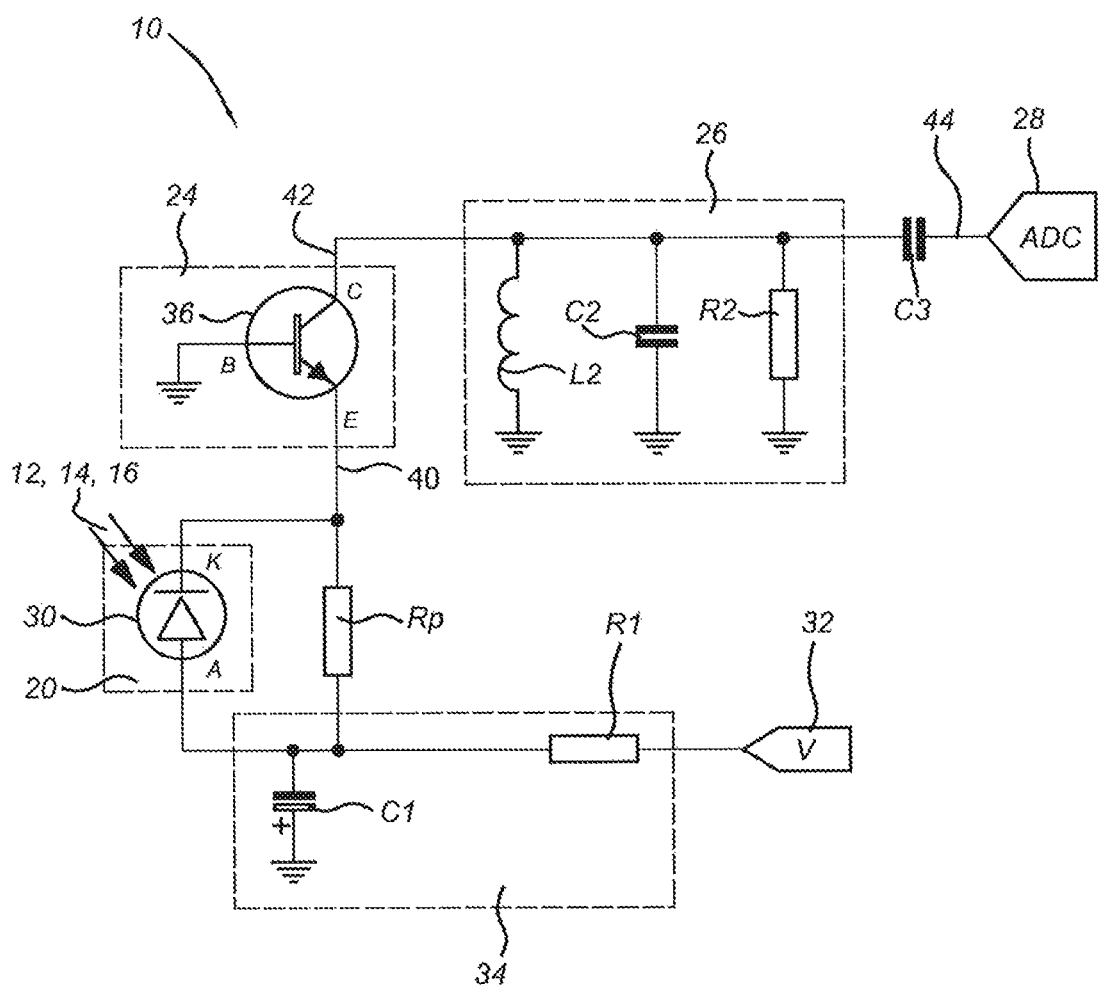
FIG. 4 schematically shows further details for the embodiment from in FIG. 3A, and FIGS. 5-8 show schematic diagrams for sensor circuits according to other embodiments.

FIG. 4 shows an exemplary embodiment of a circuit 10, with further implementation details for the principles described with reference to FIGS. 2 and 3A-B. The filter 34 includes a limiter resistor R1, for limiting the maximum average current through the SiPM sensor 20. The limiter resistor R1 is electrically connected in series, with one terminal to the voltage source 32, and with the other terminal to the anode A of the SiPM sensor 20. In this example, the limiter resistor R1 has a resistance of about 120Ω. Using only resistor R1 would cause a voltage drop across the resistor R1 to vary with the current passing through the APD elements 30, which current follows the intensity variations in the received light 12, 14, 16. The voltage across the APD elements 30 would therefore vary as well, which in turn, causes the SiPM gain to vary, and to produce non-linear amplification of any signal. This non-linear response would be less problematic if the APD elements 30 would receive only an amplitude-modulated signal 12 at a specific frequency from a source of interest. If, however, the APD elements 30 simultaneously receive light signals from other sources, e.g. unmodulated background radiation 14 and/or modulated light 16 from interfering sources, the non-linear response of the SiPM sensor 20 will cause intermodulation distortion (IMD). This IMD is represented by additional signal output components at frequencies composed of sums and differences of integer multiples of the original signal frequencies in the received light signals.

To mitigate intermodulation issues, the exemplary filter 34 includes a capacitor C1, which is connected with one terminal between the resistor R1 and the common anode A, and with the other terminal to ground. In this example, the capacitor C1 is a polarized electrolytic capacitor having a capacitance C of, e.g. 100 µF. However, this is an example only: other suitable values may be used instead. With a capacitance C=100 µF, the magnitude of the complex load impedance $Z(f)=-j/2\pi \cdot f \cdot C$ of the capacitor C1 as seen by the alternating output from the SiPM sensor 20 at the anode A and with frequencies of 1 kHz or more, will remain below $|Z|=1.5\Omega$. Oscillations in the photocurrents around a mean, due to incoming optical signals oscillating at frequencies within the predetermined operating frequency range fo, are essentially shunted via the capacitor C1, instead of flowing via the resistor R1, so that the bias voltage Vb across the SiPM sensor 20 is kept relatively constant. Intermodulation effects in the SiPM output current due to simultaneous reception of multiple signals in the operating frequency range fo are thus reduced. The resistor R1 and the capacitor C1 jointly form a passive low-pass RC-filter. In this example, the filter time constant $\tau=2\pi \cdot R \cdot C$ is 75 milliseconds.

The RC-filter may be selected to have a large time constant as well a low complex impedance $Z(f)=-j/2\pi \cdot f \cdot C$ for the capacitor. For a capacitor C1 of 100 microfarad, a resistor R1 of 120Ω, and a frequency in the alternating APD current of 1 kHz, the filter time constant $\tau=2\pi \cdot R \cdot C$ equals about 75 milliseconds, whereas the magnitude of the load impedance remains below 1.5Ω. The cut-off frequency associated with the selected RC time constant is such that slow intensity variations in ambient light 14 received by the SiPM sensor 20 are passed through, without being shunted via the capacitor C1. The bias voltage Vb may thus vary slowly along with the changing ambient light, to provide automatic gain compensation only for slow ambient light fluctuations.

So, in the circuit shown in FIG. 4, the bias voltage to the SiPM 20 is supplied by RC low pass filter 34 comprising resistor R1 and capacitor C1 that is optimized such that it performs several functions at the same time:

The cut-off frequency is such that slow variations in ambient light are passed through. This way the bias of the SiPM sensor stabilizes with respect to the ambient light. The cut-off frequency is much lower than the filters typically used in prior art circuits The resistance of resistor R1 is chosen such that the gain is automatically reduced under the influence of incident light. As explained, both the PDE and the gain are dependent on the bias voltage over the SiPM sensor. As more incident light hits the SiPM sensor, more current will flow through the resistor R1 causing the bias voltage to drop. This way both the gain and more importantly the PDE are reduced thus keeping the SiPM sensor in its linear region. For this reason R1 is also chosen much higher than in typical prior art circuits.

For modulated light sources the RC filter comprised of R1/C1 presents a low impedance to the SiPM sensor thus keeping the bias constant for AC signals within the operating frequency range. Because the bias, and thus the gain and PDE, is constant, intermodulation for these frequencies will be reduced.

In the example of FIG. 4, the current-to-voltage converter 24 comprises a common-base amplifier with a transistor 36. The emitter E of this transistor 36 is connected to the cathode K of the SiPM sensor 20. The base B of the transistor 36 is connected to ground, and the collector C of the transistor 36 forms the output terminal 42 that is connected to the band-pass filter 26. This common-base amplifier is configured to present at the emitter E a low load impedance for alternating current output at the cathode K of the SiPM sensor 20. The load impedance magnitude may range from several Ohms to several tens of Ohms in the predetermined operating frequency range fo of the amplitude-modulated VLC signals 12 and the amplitude-modulated interference signals 16, depending on the current through the SiPM sensor 20. The filter 34 and transistor 36 cooperate to form a low load impedance for the SiPM sensor 20 in the operating frequency range fo of the amplitude-modulated VLC signals 12 and the amplitude-modulated interference signals 16, and thus to keep the reverse bias voltage Vb across the APD elements 30 as constant as possible. The common base circuit with transistor 36 electrically isolates the SiPM sensor 20 from the subsequent detector circuit components, e.g. the filter stage 26 and the ADC 28. The common base circuit also isolates the capacitance of the SiPM from the filter stage 26 and amplifier so that a large bandwidth is realized.

The exemplary circuit 10 in FIG. 4 further includes a further resistor Rp, which is configured to maintain a minimum baseline current through the transistor 36 during sensor operation, even if no light is received by the APD elements 30. This further resistor Rp is connected in parallel with the SiPM sensor 20, with one terminal connected to the emitter E of the transistor 36, and with the other terminal connected to the filter 34 between the resistor R1 on the one hand and the capacitor 01 on the other hand. In this example, the further resistor Rp has a resistance of about 27 kΩ. Again, this value is only an example. Any other suitable value can be used instead.

The sensor circuit 10 further includes a RLC band-pass filter 26 to filter out the desired carrier frequency of the amplitude-modulated VLC signals 12 from the interfering frequencies and the ambient DC light. The RLC band-pass filter 26 includes an inductor L2, a capacitor C2, as well as a resistor R2 for tuning the filter bandwidth. The resistor R2, inductor L2, and capacitor C2 are electrically connected in parallel, each with one terminal connected to the collector C of transistor 36 and with another terminal connected to ground. This RLC-filter 26 is tuned via selection of appropriate values for L2, C2, and R2, to pass only the frequency band Δfc corresponding with the carrier wave and the maximum bitrate of the received VLC signal 12. The sub-carrier frequency fc on which the VLC signal 12 is modulated, is purposefully selected higher, e.g. >500 kHz, than the highest expected frequency of the interfering signals 16 and possibly also higher harmonic frequencies. The RLC-filter 26 provides analogue pre-filtering, to suppress any frequency components outside the band of interest Δfc, before the resulting signal is sampled and digitized by the ADC 28. The RLC-filter 26 is preferably tuned to pass the entire band Δfc containing the VLC communication channel for the maximum data rate that it is designed for. The required bandwidth Δfc for VLC signal 12 around the subcarrier fc equals the data rate. For example, a carrier frequency of about 800 kilohertz and a maximum bit rate of 25 kHz would require the RLC filter 26 to be tuned to a band of approximately 787 kHz to 813 kHz.

Figure 5:
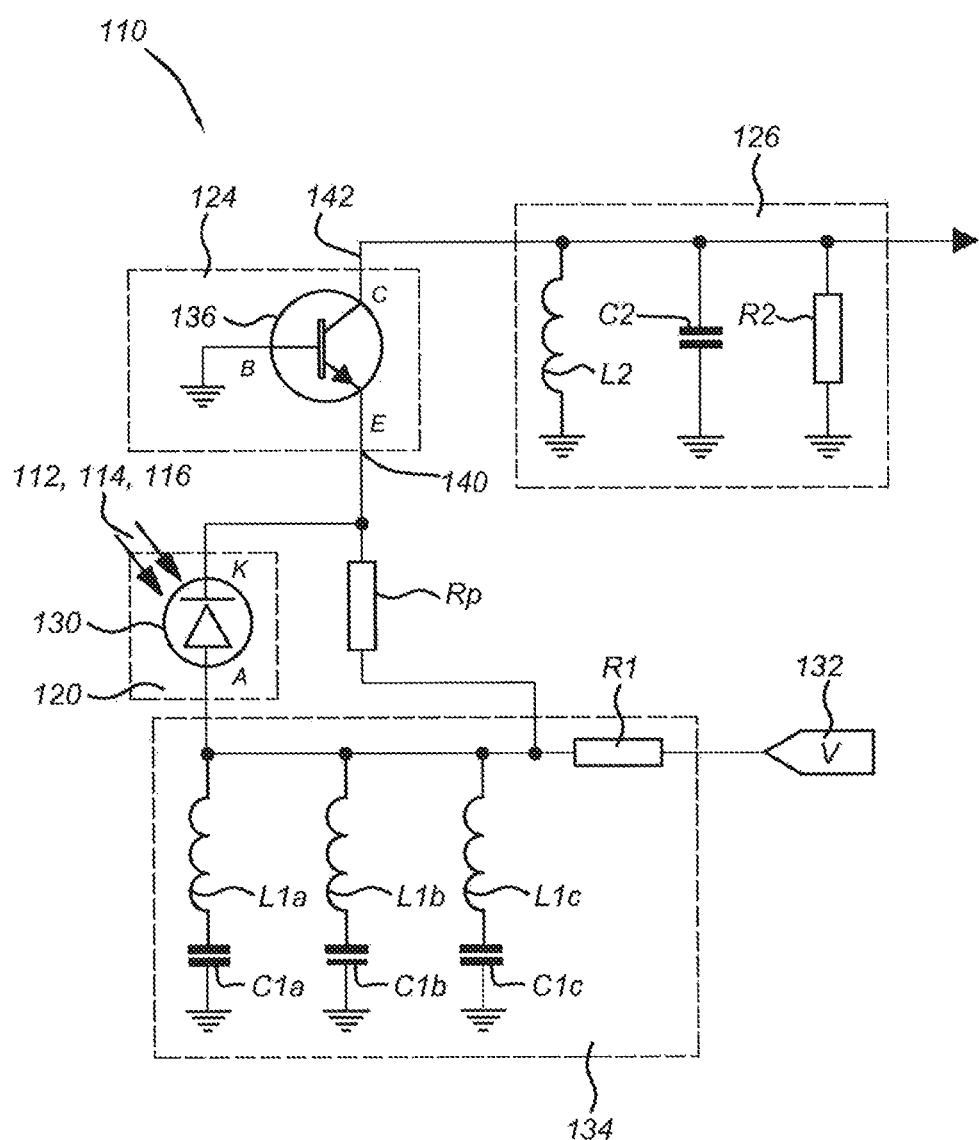

FIG. 5 shows a schematic diagram for another embodiment of a sensor circuit 110. Features in this circuit 110 that have already been described above with reference to the circuit 10 from FIGS. 1-3 may also be present in the circuit 110 in FIG. 5, and will not all be discussed here again. For the discussion with reference to FIG. 5, like features are designated with similar reference numerals preceded by 100 to distinguish the embodiments.

In this circuit 110, the bias circuit section includes a plurality of series LC resonant circuit sections L1$i$, C1$i$ (i=a, b, c, ... ). In this example, three of said filters are used. Each LC section functions as a band stop filter and covers a frequency band corresponding with a range of frequencies of amplitude-modulated optical signals 112, 116 that the SiPM sensor 120 is expected to receive. The resonant circuit sections L1$i$, C1$i$ are connected in parallel, with each resonant circuit section connected with one terminal between the resistor R1 and the common anode A of the APD elements 130, and with the other terminal to ground. Each circuit section includes its own capacitor C1$i$ and inductor L1$i$, which are connected in series. Each resonant circuit section is configured to present a low load impedance for alternating currents within subranges Δf$i$ of the predetermined operating frequency range fo of the amplitude-modulated VLC signals 112 and the amplitude-modulated interference signals 116 for the oscillating SiPM current that appears at the common anode A. The LC resonant sections are tuned differently, to cover distinct sub-ranges Δf$i$ of the predetermined operating frequency range fo of the amplitude-modulated VLC signals 112 and the amplitude-modulated interference signals 116.

Figure 6:
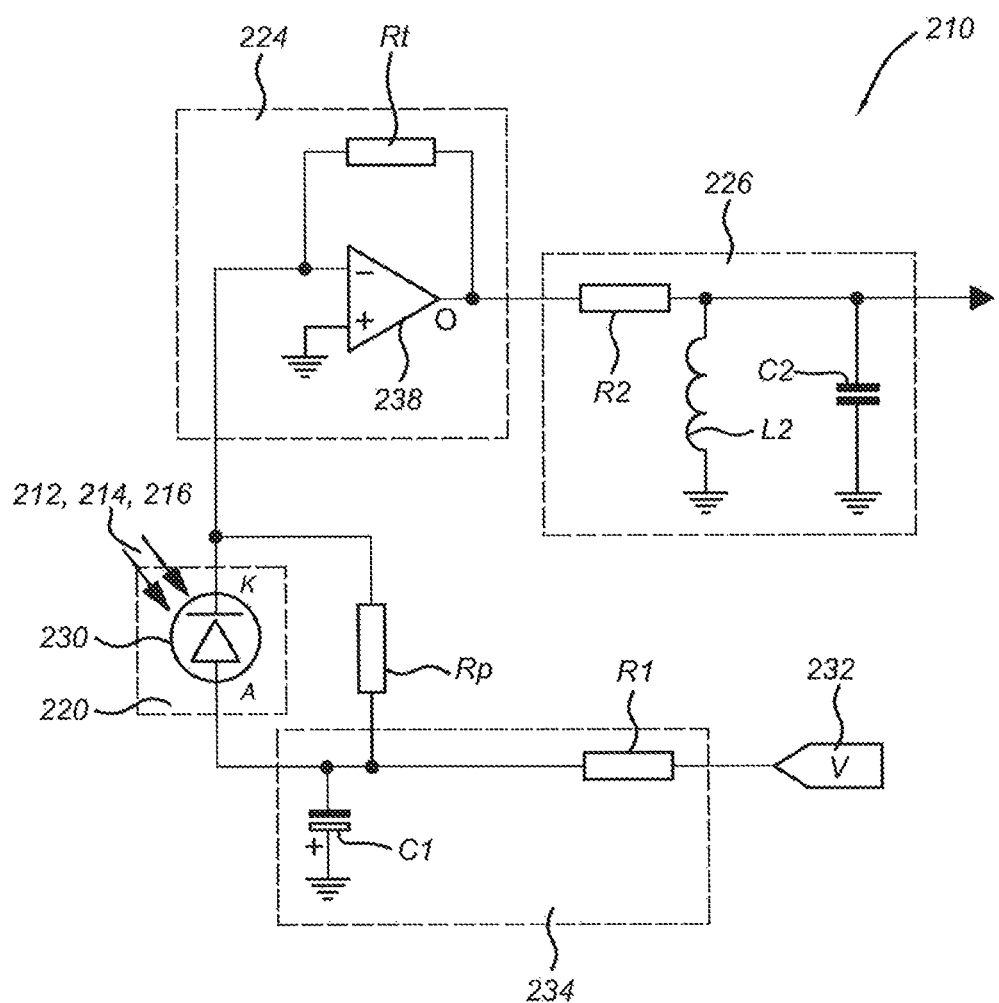

FIG. 6 shows a schematic diagram for yet another embodiment of a sensor circuit 210. Features that have been described in preceding embodiments may also be present in this circuit 210 and will not all be discussed here again. Like features have similar reference numerals, but preceded by 200.

In this circuit 210, the current-to-voltage converter 224 is formed as a trans impedance amplifier, which comprises an operational amplifier 238. The operational amplifier 238 is configured to present a low load impedance for alternating currents to the cathode K of the SiPM sensor 220 in the band of expected frequencies fo of the amplitude-modulated VLC signals 212 and the amplitude-modulated interference signals 216. The operational amplifier 238 has a non-inverting input "+", an inverting input "−", and an output O. The non-inverting input of the amplifier 238 is connected to ground. The inverting input of the amplifier 238 is connected to the common cathode K of the SiPM sensor 220, but also receives a negative feedback voltage from the output O via a transimpedance resistor Rt. This resistor Rt is connected between the inverting input and the output O of the amplifier 238. The gain of the current is determined by Rt.

The sensor circuit 210, like the sensor circuit 10 of FIG. 4, further includes RLC band-pass filter 226, which includes inductor L2, capacitor C2, as well as resistor R2 for tuning filter quality. Resistor R2 is connected in a different way than in the circuit of FIG. 4. I.e., the inductor L2, and capacitor C2 are electrically connected in parallel between ground and one terminal of resistor R2. The other terminal of resistor R2 is connected to output O of operational amplifier 224. Again, this RLC-filter 226 is tuned via selection of appropriate values for L2, C2, and R2, to pass only the frequency band Δfc corresponding with the carrier wave and the maximum bitrate of the received VLC signal 12.

Figure 7:
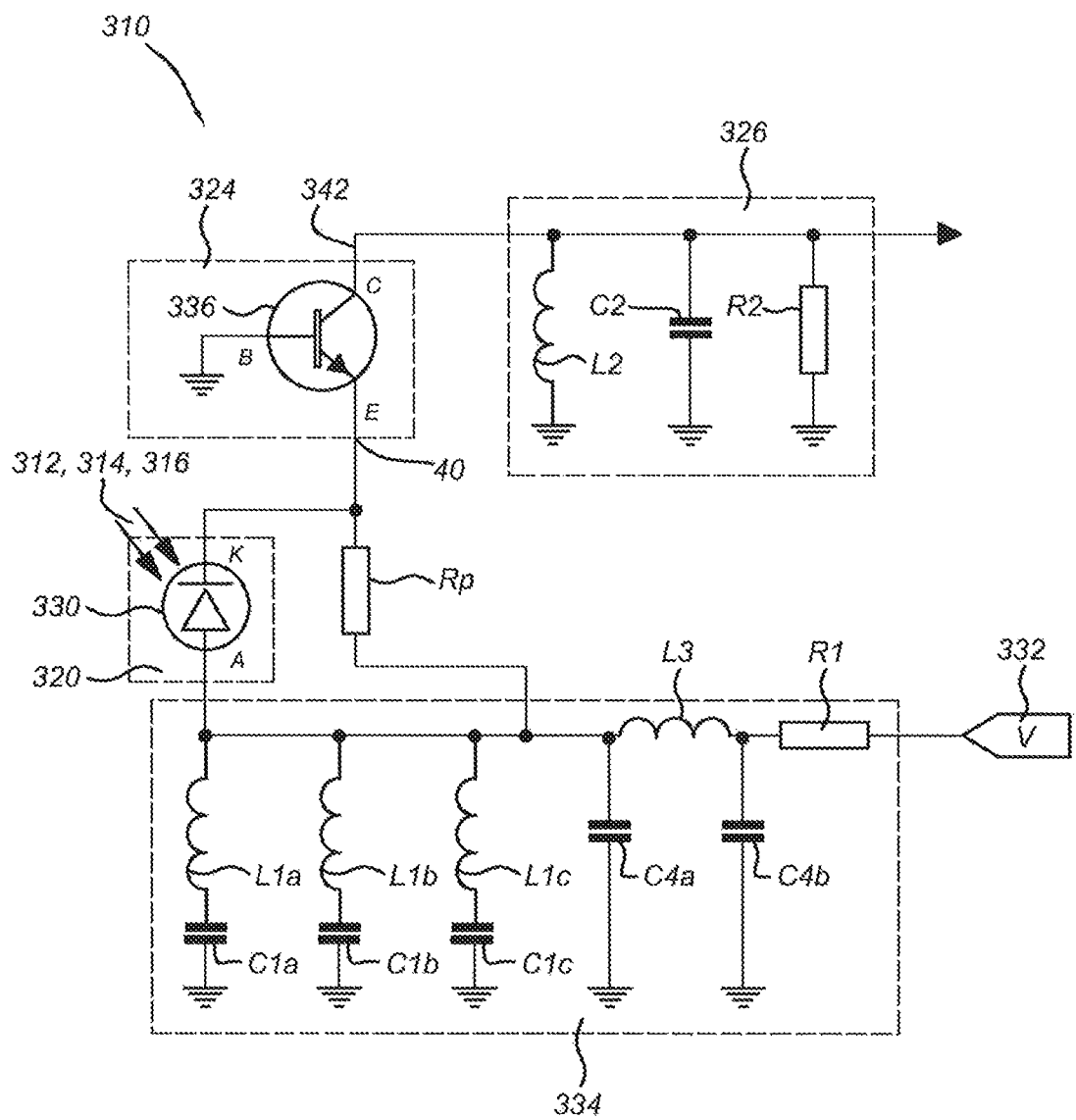

FIG. 7 shows a schematic diagram of another embodiment 310, where an additional LC filter is used. The LC filter allows for a steeper transition between the low impedance AC operating frequency range and the high impedance current limiting range. Such LC filters could have a pi-topology, T-topology, L-topology and/or any variation thereof. In addition, resistors could be used to control the quality factor of the filter.

Figure 8:
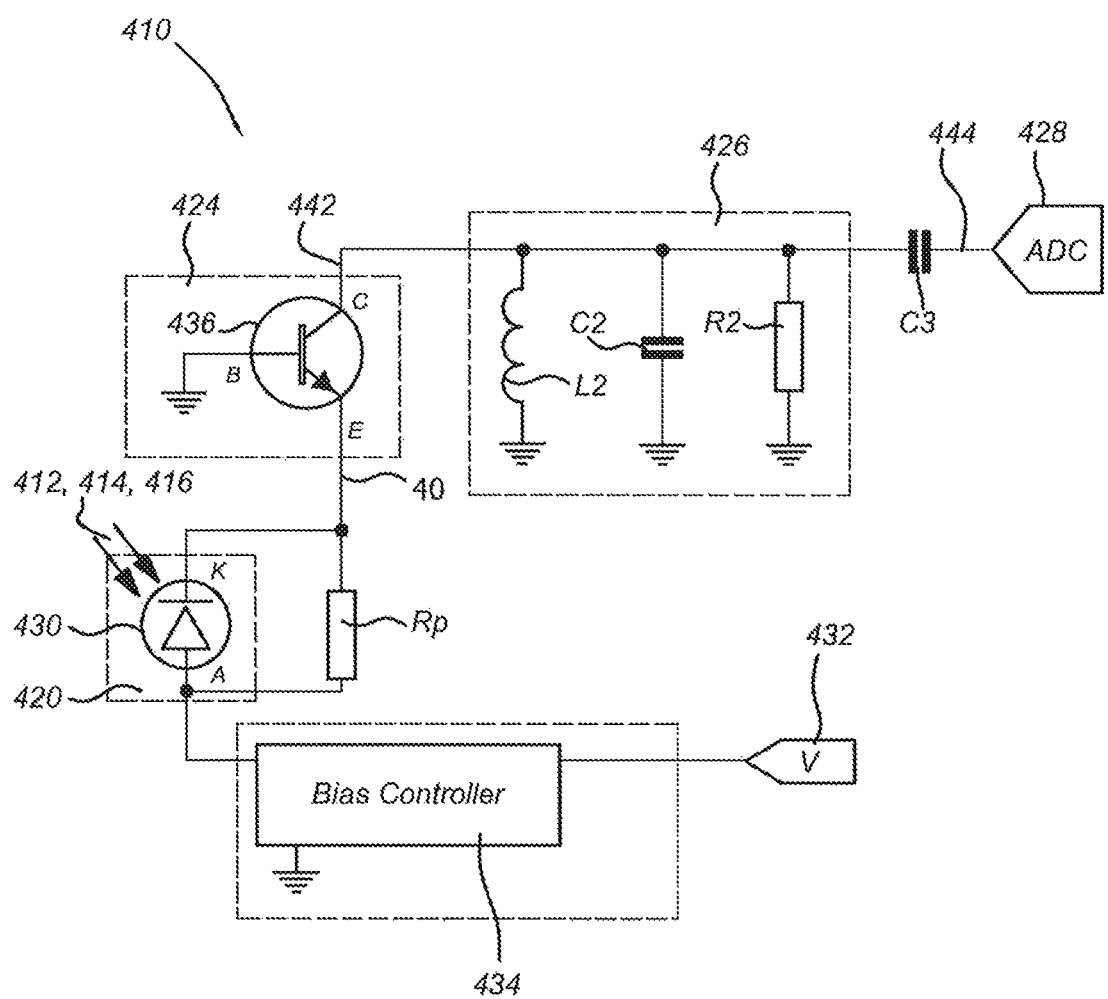

FIG. 8 shows a schematic diagram of another embodiment 410, where the bias controller 434 is implemented comprising active components like transistors, operational amplifiers, signal processors using analogue to digital converters (ADC) and/or digital to analogue converters (DAC), microprocessors, DC-DC converters, inverters and similar such devices. The bias controller 434 may be powered by a DC voltage supply 432, and is further connected to the anode of the SiPM sensor 420. The various supply voltages needed by the various active components of the bias controller 434, including the reverse bias voltage supply are generated inside the bias controller module, e.g. using DC-DC converters. Alternative embodiments could use external power supplies. The output of this bias controller module provides the reverse bias voltage to the anode of the SiPM sensor, and simultaneously acts as a time varying current limiter. The time varying current limiting characteristics of said module are tuned such that the load impedance for AC currents is as low as possible over the operating frequency range, while at the same time it ensures that the SiPM is always operating within the safe operating area (SOA). These two requirements are opposed to each other. To achieve a lower AC impedance for a certain frequency, the current limiting control loop requires to have a larger time constant, meaning that the current limiting function will act slower. To protect the SiPM sensor against damage however, the current limiting function needs to be fast enough to ensure the SiPM sensor stays within the safe operating area (SOA). In this embodiment an optimum current limiting characteristic can be achieved, which just satisfies the safe operating area (SOA) but at the same time ensures the lowest possible AC impedance seen from the anode of the SiPM sensor, for frequencies approaching the frequency band where the current limiting function is active.

In a further embodiment, the bias controller 434 may provide a plurality of current limiters each having specific characteristics, optimized for a specific requirement, but acting simultaneously. The first current limiter is optimized to just satisfy the safe operating area (SOA) of the SiPM sensor. The second current limiter however is configured to act at a lower current limit than the first one, and has a time constant much larger than the first current limiter which just satisfies the SOA requirement. If the current remains below the limits dictated by keeping the SiPM within its safe operating area, this second current limiter will be the only one guarding the current and adjusting the reverse bias voltage in case the configured current is exceeded. Further current limiters could be added to provide optimized bias voltage control for AC currents of a specific frequency range, e.g. the variations in current caused by surface wave motion exposed to ambient sun light in a subsea optical communication system, or the very slow variations in AC current caused by ambient sunlight changes over a day. It is important that the configured current limits are time constant dependent such that a limiter with a larger time constant is configured for a lower current limit than another current limiter. Not adhering to this rule would mean that the current limiter with a lower time constant would never activate and therefore be obsolete.

In embodiments comprising active components, microcontrollers can be used to realize more complex current limiting schemes. For example, the time constants could be different for the leading and trailing edge of the current limiting event. In such an embodiment, the leading edge time constant of the first current limiter could be made fast, i.e. steep, such that the bias voltage is reduced quickly in the event of sudden saturation thereby preventing exceeding the SOA of the device. A dynamic time constant, adapted for the circumstances, for the trailing edge ensures an optimized low AC impedance. In order to determine the dynamic trailing edge parameters machine learning algorithms or artificial intelligence systems could be used to control those parameters.

While the above embodiments make mainly use of SiPM sensors and APD arrays, this invention is not limited to such sensors. In principle, this invention augment front ends for non-linear sensors requiring a bias voltage or bias current. Sensors can be, but not limited to, Hall effector sensors, LDR, PTC or NTC resistors, photodiodes, PIN photodiodes. Further, regular semiconductors, such as diodes and transistors can be used as temperature sensors. The skilled person would understand that such use of semi-conductor devices will benefit from a bias voltage and/or current.

LIST OF REFERENCE SYMBOLS

Similar reference numbers that have been used in the description to indicate similar elements (but differing only in the hundreds) have been omitted from the list below, but should be considered implicitly included
10 sensor circuit
12 optical signal
14 ambient light
16 interference signal
20 SiPM sensor
22 bias circuit section
24 current-to-voltage converter
26 band pass filter
28 ADC
30 APD elements
32 bias voltage source
34 current limiting bias circuit (e.g. RC low-pass filter)
36 transistor
40 input terminal
42 output terminal
44 analogue sensor output
134 current limiting bias circuit (e.g. band-stop filter with series LC shunt sections)
238 operational amplifier
A common anode
K common cathode
E emitter
C collector
B base
C1 capacitor
C2 further capacitor
L1 inductance
L2 further inductance
R1 resistor
R2 further resistor
Rp parallel resistor
Rt transimpedance resistor
Δfc frequency band of communication signal
fo operating frequency range of expected optical signals

The invention claimed is:

1. A sensor circuit, comprising:
    a silicon photomultiplier, SiPM, sensor including an array of avalanche photodiode, APD, elements that are connected in parallel between a common cathode and a common anode;
    a voltage source, configured to apply a reversed bias voltage across the SiPM sensor, to let each of the APD elements operate in reverse-biased Geiger mode, and to let the array of APD elements operate in integration mode;
    a current-to-voltage converter, electrically connected with an input terminal to the common cathode of the SiPM sensor, and configured to convert a current from the common cathode of the SiPM sensor into a voltage and provide said voltage on an output terminal of said converter;
    a limiting bias circuit connected between the voltage source and the common anode of the SiPM sensor, wherein the bias circuit is configured to limit currents through the APD elements, and configured to present an AC load impedance for an alternating current within a predetermined operating frequency range generated by the APD elements at the common anode as well as a DC load impedance, such that said AC load impedance is lower than said DC load impedance.

2. The sensor circuit, according to claim 1, wherein the predetermined operating frequency range in which the AC load impedance is at least 10 times lower than the DC load impedance.

3. The sensor circuit according to claim 1, wherein the DC load impedance of the bias circuit is in a range of 50Ω-10Ω, and the AC load impedance for said operating frequency range is in a range between 0Ω and 10Ω.

4. The sensor circuit according to claim 1, wherein the bias circuit comprises:
    a limiter resistor connected in series between the voltage source and the common anode of the SiPM sensor, and configured to limit the current through the SiPM sensor.

5. The sensor circuit according to claim 4, wherein the output voltage of the voltage source and a resistance of the limiter resistor are selected so that the resulting average overvoltage across the APD elements causes operation in a quasi linear part of a photon detection efficiency response characteristic and gain characteristic of the SiPM sensor.

6. The sensor circuit according to claim 4, wherein the bias circuit comprises:
    a capacitor connected between the resistor and the common anode on the one hand, and to ground on the other hand.

7. The sensor circuit according to claim 6, wherein the capacitor has a capacitance of at least 1 microfarad.

8. The sensor circuit according to claim 4, wherein the bias circuit comprises:
    a resonant circuit section connected between the common anode of the SiPM sensor and ground, wherein the circuit section includes a capacitor and an inductor connected in series, and is configured to present the low load impedance for alternating currents within at least part of the predetermined operating frequency range generated by the APD elements at the common anode.

9. The sensor circuit according to claim 8, further comprising a low-pass filter, the low-pass filter comprising:
    further resonant circuit sections connected between the common anode of the SiPM sensor and ground, wherein each of the further circuit sections includes a further capacitor and a further inductor connected in series, and each configured to present a low load impedance for alternating currents within further parts of the predetermined operating frequency range generated by the APD elements at the common anode.

10. The sensor circuit according to claim 1, wherein the current-to-voltage converter comprises a common-base circuit, including a transistor with an emitter that is connected to the common cathode of the SiPM sensor, with a base that is connected to ground, and with a collector that forms a signal output.

11. The sensor circuit according to claim 1, wherein said current-to-voltage converter comprises an operational amplifier with an output, a non-inverting input that is connected to ground, and with an inverting input that is connected to the common cathode of the SiPM sensor as well as to a feedback voltage from the output via a further resistor.

12. The sensor circuit according to claim 10, further comprising:
a further resistor connected between the current-to-voltage converter and the current limiting bias circuit, and configured to maintain a minimum baseline current through the current-to-voltage converter.

13. The sensor circuit according to claim 1, further comprising:
a parallel resonant band-pass filter, which is provided between the output of the current-to-voltage converter and an analogue sensor output, and which is configured to pass only a frequency band corresponding to a carrier wave and a maximum bitrate of a communication signal to the analogue sensor output.

14. The sensor circuit according to claim 1, further comprising at least one microcontroller, wherein the at least one microcontroller is configured to generate complex current limiting schemes.

15. The sensor circuit according to claim 14, wherein the at least one microcontroller is configured to generate current limiting schemes in which the time constants could be different for the leading and trailing edge of a current limiting event.

16. The sensor circuit according to claim 15, wherein the at least one microcontroller is configured to generate current limiting schemes in which the leading edge time constant of a first current limiter could be made fast, such that the bias voltage is reduced quickly in the event of sudden saturation thereby preventing exceeding the SOA of the device.

17. The sensor circuit according to claim 15, wherein the at least one microcontroller is configured to generate current limiting schemes in which the trailing edge ensures an optimized low AC impedance.

18. The sensor circuit according to claim 14, wherein the at least one microcontroller is configured to generate current limiting schemes, wherein the leading and trailing edges' parameters are generated by machine learning algorithms or artificial intelligence systems.

19. A sensor circuit, comprising:
a non-linear semi-conductor sensor;
a bias circuit, configured to apply an electrical bias across the non-linear semi-conductor sensor;
a signal sensing converter, electrically connected with an input terminal to the non-linear semi-conductor sensor, and configured to convert an electrical signal from the output terminal of the non-linear semi-conductor sensor into a measurement signal and provide said measurement signal on an output terminal of said converter;
a bias circuit connected between an electrical source and the input terminal of the non-linear semi-conductor sensor, wherein the bias circuit is configured to limit the electrical bias through the non-linear semi-conductor sensor, and configured to present an AC load impedance for an alternating electrical signal within a predetermined operating frequency range generated by the non-linear semi-conductor sensor as well as a DC load impedance, such that said AC load impedance is different from said DC load impedance.

20. A method for operating a sensor circuit the method comprising:
applying, with a voltage source, a reversed bias voltage across an avalanche photodiode, APD, elements of a silicon photomultiplier, SiPM, sensor, to let each of the APD elements operate in reverse-biased mode, and to let an array of APD elements operate in integration mode;
receiving, with the APD elements, a plurality of amplitude-modulated light signals which oscillate in time corresponding to frequency bands within a predetermined operating frequency range;
converting, with a current-to-voltage converter, a current from the common cathode of the array of APD elements into a voltage, and providing said voltage on the output terminal of said converter, and;
forming, with a bias circuit, an AC load impedance for an alternating current within the predetermined operating frequency range generated by the APD elements at the common anode of the array of APD elements, as well as a DC load impedance, such that said AC load impedance is at least 10 times lower than said DC load impedance, thereby reducing or minimizing intermodulation distortion in the current generated by the SiPM sensor in response to the received amplitude-modulated light signals.

21. A method for operating a sensor circuit, the method comprising:
applying, with a bias circuit, an electrical bias across a non-linear semi-conductor sensor;
receiving, with the non-linear semi-conductor sensor, a plurality of modulated signals which oscillate in time corresponding to frequency bands within a predetermined operating frequency range;
converting, with a signal sensing converter, an electrical signal from the non-linear semi-conductor sensor into a measurement signal, and providing said measurement signal on the output terminal of said converter, and;
forming, with the bias circuit, an AC load impedance for an alternating electrical signal within the predetermined operating frequency range generated by the non-linear semi-conductor sensor, as well as a DC load impedance, such that said AC load impedance is different from said DC load impedance, so as to reduce or minimize intermodulation distortion in the electrical signal generated by the non-linear semi-conductor sensor in response to the modulated signals.

* * * * *